(12) United States Patent
Kim

(10) Patent No.: US 10,278,299 B2
(45) Date of Patent: Apr. 30, 2019

(54) STAND FOR ELECTRONIC DEVICE

(71) Applicant: SPIGEN KOREA CO., LTD., Seoul (KR)

(72) Inventor: Dae-Young Kim, Seoul (KR)

(73) Assignee: SPIGEN KOREA CO., LTD., Seoul (KR)

( * ) Notice: Subject to any disclaimer, the term of this patent is extended or adjusted under 35 U.S.C. 154(b) by 0 days.

(21) Appl. No.: 15/344,533

(22) Filed: Nov. 6, 2016

(65) Prior Publication Data
US 2017/0135234 A1 May 11, 2017

(30) Foreign Application Priority Data

Nov. 6, 2015 (KR) .................. 20-2015-0007224 U

(51) Int. Cl.
| | |
|---|---|
| *H05K 5/02* | (2006.01) |
| *H05K 5/03* | (2006.01) |
| *E05D 11/00* | (2006.01) |
| *E05D 3/02* | (2006.01) |
| *F16B 11/00* | (2006.01) |
| *F16M 13/02* | (2006.01) |
| *H04B 1/38* | (2015.01) |
| *H04M 1/06* | (2006.01) |
| *A45F 5/00* | (2006.01) |
| *H05K 7/00* | (2006.01) |

(52) U.S. Cl.
CPC .......... *H05K 5/0234* (2013.01); *E05D 3/022* (2013.01); *E05D 11/0054* (2013.01); *F16B 11/006* (2013.01); *F16M 13/02* (2013.01); *H05K 5/0226* (2013.01); *H05K 5/03* (2013.01); *A45F 5/00* (2013.01); *H05K 7/00* (2013.01)

(58) Field of Classification Search
CPC .. H04M 1/06; H04M 1/12; H04B 1/38; B60R 11/02; A44B 13/00; F16M 13/022; A45F 5/00; H05K 7/00
USPC ......... 248/205.3, 126, 133, 144, 155.1, 423, 248/917; 361/679.01
See application file for complete search history.

(56) References Cited

U.S. PATENT DOCUMENTS

| 8,382,059 B2 * | 2/2013 | Le Gette ................ F16M 11/04 248/163.1 |
| 9,179,565 B2 * | 11/2015 | Cho ......................... H05K 7/00 |
| 9,397,717 B2 * | 7/2016 | Curran ................... H04B 1/385 |

(Continued)

FOREIGN PATENT DOCUMENTS

| KR | 10-1316363 | 10/2013 |
| KR | 10-20140123649 | 1/2015 |
| KR | 20-0476134 | 2/2015 |

*Primary Examiner* — Tan Le
(74) *Attorney, Agent, or Firm* — Heedong Chae; Lucem, PC

(57) ABSTRACT

A stand for an electronic device includes a base, a ring, a hinge, a cover and a hinge receiving wall and an adhesive provided on a surface of the base so that the base can be attached to the electronic device. The ring further includes a cylindrical engaging portion on a portion of the ring. The hinge includes a protrusion and an engaging groove which is formed by a cutout space on a side of the hinge. The hinge is received a shape corresponding to the engaging portion of the ring in the engaging groove. The cover for covering the hinge in the cover is received a shape corresponding to the hinge to snugly fit the hinge therein. The hinge receiving wall receives the protrusion of the hinge.

20 Claims, 13 Drawing Sheets

(56) References Cited

U.S. PATENT DOCUMENTS

| | | | |
|---|---|---|---|
| 9,421,920 B2* | 8/2016 | Jang | A45F 5/00 |
| D782,488 S * | 3/2017 | Kim | D14/447 |
| 9,723,910 B2* | 8/2017 | Due | A45F 5/10 |
| 2001/0040202 A1* | 11/2001 | Adams, IV | A47K 1/09 |
| | | | 248/206.2 |
| 2013/0279098 A1* | 10/2013 | Cho | H05K 7/00 |
| | | | 361/679.01 |
| 2015/0312389 A1* | 10/2015 | Curran | H04B 1/385 |
| | | | 455/575.6 |
| 2016/0353867 A1* | 12/2016 | Due | A45F 5/10 |

* cited by examiner (a)

(b)

(e)

(f)

STAND FOR ELECTRONIC DEVICE

CROSS-REFERENCE TO RELATED APPLICATIONS

This application claims priority of Korean Application No. 20-2015-0007224, filed Nov. 6, 2015 with the Korean Intellectual Property Office, the disclosure of which is incorporated herein by reference.

FIELD OF THE INVENTION

The present invention relates to a stand for an electronic mobile device, and more particularly, to a stand having a base, a ring and an adhesive pad. The stand is securely attached to the electronic device, and thus the user can securely and conveniently use the electronic device whether the user is holding it or if it is self-standing or mounted on a surface.

BACKGROUND OF THE INVENTION

Electronic devices, such as mobile phones, cell phones, smart phones, tablet computers or the like, have become popular and widely used for communication, entertainment purposes and other purposes. These electronic devices are intended to be carried or moved about and as such, they are prone to being accidentally dropped, hit, or scratched. To protect these electronic devices, protective films for display and protective cases have been introduced and widely used in connection with the devices. However, while such protective films for display and protective cases may help to reduce damage when electronic devices are dropped, they will not prevent the electronic devices from being dropped.

Electronic devices are usually held in the user's hand. In recent years, larger screens on such devices have become more popular resulting in a trend toward the popularity of larger devices. Accordingly, these larger electronic mobile devices have become more difficult to hold in one hand for many users and have necessitated a way to more securely and conveniently grasp such devices. Korean Patent Application Publication 20-2013-0007233 discloses "A smartphone handle with transmitter-receiver and support function". According to the prior art, a handle, which is connected to a smartphone by a coil, is configured for using the smartphone while hanging the handle on a wrist.

However, the handle and coil adds undesirable bulk and weight to the smartphone and, thus, the user may have an uncomfortable experience using the smartphone and difficulty for conveniently and holding it.

Thus, such a handle cannot satisfy a user's need for conveniently holding an electronic device and the need for easily standing the electronic device at various angles of tilt on a surface to view video content while maintaining the portability of such an electronic device.

Therefore, to solve the above problems, there is a need for a stand for an electronic device which is attachable to any location of a protective case or electronic device. This invention is directed to solve these problems and satisfy the long-felt market need.

SUMMARY OF THE INVENTION

The present invention is directed to a stand for an electronic device. The stand, which provides portability without adding unnecessary bulk, allows the user to easily hold the electronic device or stand the electronic device at various angles on a flat surface according to the user's needs. The electronic device may be a mobile phone, cellphone, smartphone, tablet computer, or the like.

One embodiment of the present invention provides a stand for an electronic device, including: a base having a top surface and a bottom surface, wherein a securely attachable adhesive pad for the electronic device covers the bottom surface of the base; a ring having a cylindrical engaging portion; a hinge, having a protrusion and an engaging groove which is formed by a cutout space on a side of the hinge, constructed to receive a shape corresponding to the engaging portion of the ring in the engaging groove and wherein the hinge is made of an elastic material; a cover for covering the hinge wherein the cover is constructed to receive a shape corresponding to the hinge to snugly fit the hinge therein; and a hinge receiving wall to receive the protrusion of the hinge.

According to another embodiment, the stand may further include a coupling part constructed to receive the hinge receiving wall which is constructed to fixedly attach to the protrusion of the hinge and rotatably and pivotably couple with the base, wherein the coupling part may further include a mating plate constructed to attach to the hinge receiving wall, and wherein the coupling part may be positioned on the bottom of the base.

According to another embodiment, the mating plate may further include an opening, wherein the cover may be mated through at least one of the opening of the mating plate and positioned on the top surface of the base.

According to another embodiment, the stand may further include an O-ring positioned between the cover and the mating plate.

According to another embodiment, the O-ring may be made of a thermoplastic material.

According to another embodiment, the base may further include an aperture and a recess formed on the bottom surface of the base surrounding the aperture, wherein the mating plate may be received in the recess.

According to another embodiment, the stand may further include a holder, wherein the holder may include a recessed groove constructed to have a size corresponding to an inner diameter of the ring; and a cover engaging portion for engaging the cover which may be positioned on a part of the recessed groove; and the securely attachable adhesive pad.

According to another embodiment, the coupling part may further include supporting walls formed on both sides of the hinge receiving wall to support the engaging portion of the ring.

According to another embodiment, the hinge may be made of a thermoplastic polyurethane material.

Another embodiment of the present invention provides a stand for an electronic device, including: a base having a top surface and a bottom surface, wherein a securely attachable adhesive pad for the electronic device covers the bottom surface of the base; a ring having a cylindrical engaging portion on a portion of the ring; a hinge, having a protrusion and an engaging groove which is formed by a cutout space on a side of the hinge, constructed to receive a shape corresponding to the engaging portion of the ring in the engaging groove and wherein the hinge is made of at least one material selected from a group consisting of polyoxymethyene, polyformaldehyde, and polyacetal; a cover for covering the hinge wherein the cover is constructed to receive a shape corresponding to the hinge to snugly fit the hinge therein; and a hinge receiving wall to receive the protrusion of the hinge.

According to another embodiment, the stand may further include a coupling part constructed to receive the hinge receiving wall which may be constructed to fixedly attach to the protrusion of the hinge and rotatably and pivotably couple with the base, wherein the coupling part may further include a mating plate constructed to attach to the hinge receiving wall, and wherein the coupling part may be positioned on the bottom of the base.

According to another embodiment, the mating plate may further include an opening, wherein the cover may be mated through at least one of the opening of the mating plate and positioned on the top surface of the base.

According to another embodiment, the stand may further include an O-ring positioned between the cover and the mating plate.

According to another embodiment, the O-ring may be made of a thermoplastic material.

According to another embodiment, the base may further include an aperture for receiving the coupling part 140.

According to another embodiment, the stand may further include a holder, wherein the holder may include a recessed groove constructed to have a size corresponding to an inner diameter of the ring; and a cover engaging portion for engaging the cover which may be positioned on a part of the recessed groove; and the securely attachable adhesive pad.

According to another embodiment, the coupling part may further include supporting walls formed on both sides of the hinge receiving wall to support the engaging portion of the ring.

Another embodiment of the present invention provides a stand for an electronic device, including: a base having a top surface and a bottom surface, wherein a securely attachable adhesive pad for the electronic device covers the bottom surface of the base; a ring having a cylindrical engaging portion on a portion of the ring; a hinge, having an engaging groove which is formed by a cutout space on a side of the hinge, constructed to receive a shape corresponding to the engaging portion of the ring in the engaging groove and wherein the hinge is made of at least one material selected from a group consisting of polyoxymethyene, polyformaldehyde, and polyacetal; a coupling part having at least one of a opening; and a cover for covering the hinge therein wherein the cover is coupled to at least one of the opening and is positioned on a top surface of the base.

According to another embodiment, the holder may include a recessed groove constructed to have a size corresponding to an inner diameter of the ring; and a cover engaging portion for engaging the cover which may be positioned on a part of the recessed groove; and the securely attachable adhesive pad.

According to another embodiment of the invention, the cover may be mated with the mating plate at two openings.

The advantages of the present invention are: (1) the stand of the present invention can be attached to any place of a protective case or an electronic device that a user can select location for his convenience; (2) the stand of the present invention utilizes a frictional fit between the engaging portion of the ring and the hinge, and thus the user can adjust the orientation of the ring by manually pushing or pulling the ring; (3) the stand of the present invention provides the ring structure so that user can carry and hold the electronic device conveniently by inserting user's finger therein; (4) the stand of the present invention has a complicated structure but can be conveniently and effectively manufactured; (5) the cover of the stand is securely engaged with both sides of the hinge so that the hinge is fixedly attached to the ring by a snug fitting of the cover; (6) the stand of the present invention provides the holder having the attachable adhesive pad to attach to any flat surface or curved surface, and thus user can mount the electronic device on various surface by mounting on the holder; and (7) the stand of the present invention is constructed to be slim and compact.

Although the present invention is briefly summarized, the fuller understanding of the invention can be obtained by the following drawings, detailed description and appended claims.

BRIEF DESCRIPTION OF THE DRAWINGS

These and other features, aspects and advantages of the present invention will become better understood with reference to the accompanying drawings, wherein.

DETAILED DESCRIPTION OF THE EMBODIMENTS OF THE INVENTION

Reference will now be made in detail to the preferred embodiments of the present invention, examples of which are illustrated in the accompanying drawings, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

Also, as used in the specification including the appended claims, the singular forms "a", "an", and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about", it will be understood that the particular value forms another embodiment.

Figure 1:
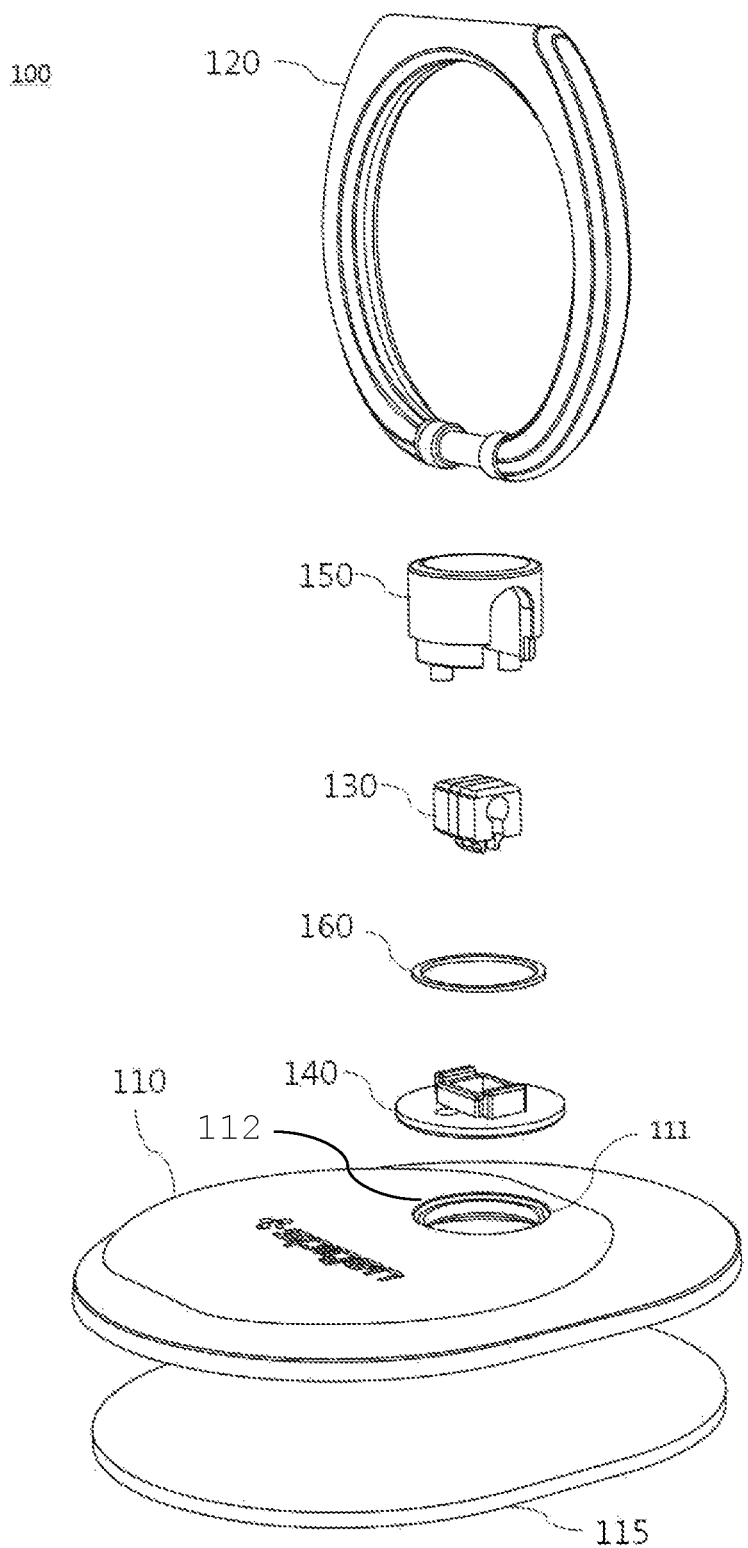
FIG. 1 shows a perspective view of each elements of the stand of the electronic device of the present invention.

FIG. 1 shows a perspective view of each element of the stand of the electronic device of the present invention.

As shown in FIG. 1, a stand for an electronic device of present invention may include a base 110, an attachable adhesive pad 115 on a surface of the base 110, a ring 120, a hinge 130 and a coupling portion 140. The base 110 may include an aperture 111. The aperture 111 may be an opening 111 constructed to receive a size corresponding to the hinge. The stand 100 for the electronic device 10 may be securely attachable to a surface of the electronic device 10 using the adhesive pad 115. The adhesive pad 115 may include an adhesive layer or sheet.

In addition, the stand 100 for the electronic device further may include a cover 150. The stand may further include an O-ring 160.

Figure 2:
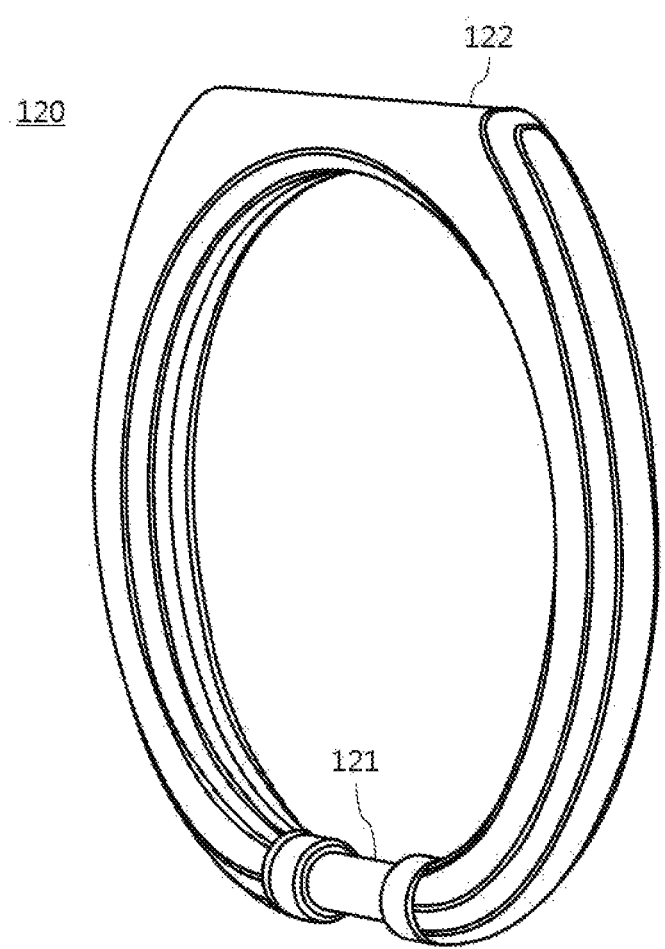
FIG. 2 shows a perspective view of the ring of the stand of the present invention.

FIG. 2 shows a perspective view of the ring 120 of the stand of the present invention. The ring 120 may be made of a rigid material, such as a steel or a plastic like polycarbonate, but not limited.

As in FIG. 2, the ring 120 may include a cylindrical engaging portion 121 on a portion of the ring 120. A diameter or a cross section of the engaging portion 121 may be smaller than a diameter or a cross section of the ring 120, but not limited. According to one embodiment, the engaging portion 121 is cylindrical in FIG. 2, but the shape of the engaging portion may change.

In addition, the ring 120 may include a flat portion 122 on an outer side of an opposite position of the engaging portion 121. The flat portion 122 may form a contact area with a plane when the stand 100 is placed on a flat surface.

Figure 3:
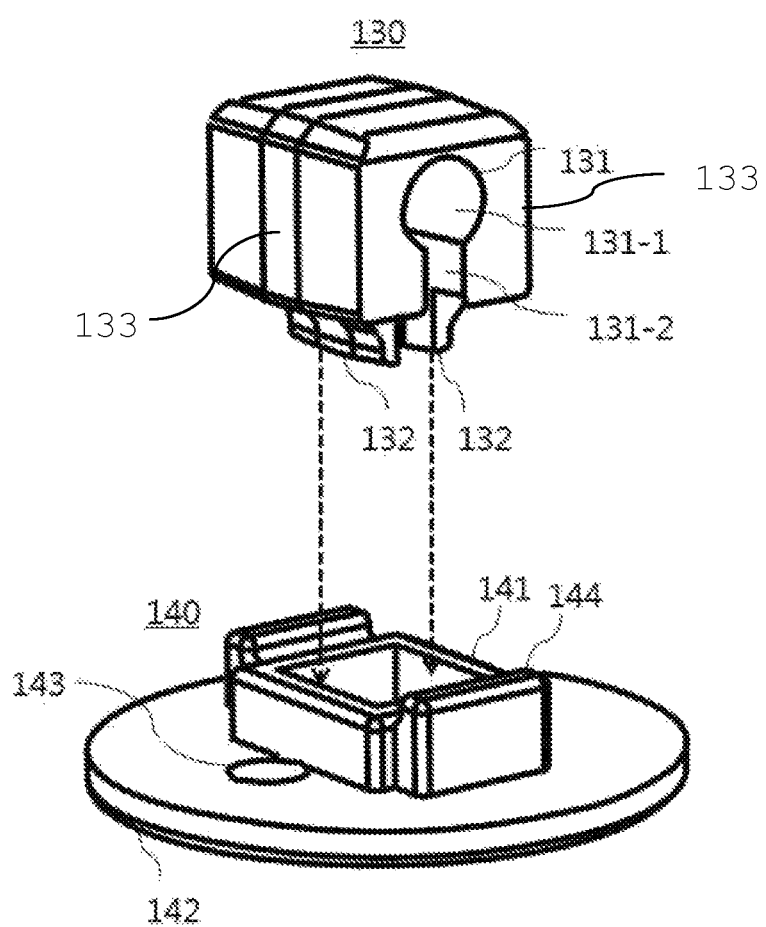
FIG. 3 shows a perspective view of the hinge and the coupling part of the stand of the present invention.

FIG. 3 shows a perspective view of the hinge and the coupling part 140 of the stand 100 of the present invention. The hinge 130 may be made of an elastic material. For example, the hinge 130 may be made of thermoplastic polyurethane or rubber, but not limited. The hinge 130 may include an engaging groove 131. The engaging groove 131 may include a space 131-1 receiving the engaging portion 121 of the ring 120 and a cutout space 131-2 along a side of the space 131-1. In addition, the hinge 130 may be made of polyoxymethylene. Polyoxymethylene is also known as polyformaldehyde or polyacetal.

Furthermore, the hinge 130 may include a protrusion 132 on both sides of the cutout space 131-2. The protrusion 132 is received in the hinge receiving wall 141 of the coupling part 140. The protrusion 132 may be inserted in the hinge receiving wall 141 while the engaging portion 121 of the ring 120 is received in the engaging groove 131 of the hinge 130 and, thus, the engaging portion 121 is provided friction with a contact area of the engaging groove 131 while the contact area of the engaging groove 131 in contact with the engaging portion 121 presses the engaging portion 121.

According to one embodiment, the coupling part 140 may further include supporting walls 144 formed on both sides of the hinge receiving wall 141. The supporting wall 144 may support the ring 120 when the ring 120 is coupled with the coupling part 140 by the hinge 130. A shape of the support wall 144 is formed according to various embodiments.

Figure 4:
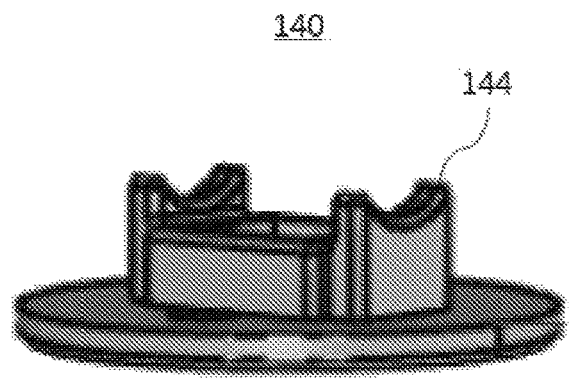
FIG. 4 shows a perspective view of the coupling part of the stand of another embodiment of the present invention.

FIG. 4 shows a perspective view of the coupling part 140 of the stand 100 of another embodiment of the present invention. For example, the supporting wall 144 may be formed into a shape corresponding to the cylindrical engaging portion 121 as in FIG. 4 to support the engaging portion 121.

In addition, the coupling part 140 may further include a mating plate 142 to mate with the base 110 and an opening 143 to couple between the cover 150 and the coupling part 140. The coupling part 140 may be coupled rotatably while the coupling part 140 is coupled with the base 110. Preferably, the mating plate 142 is formed into a circular plate, but not limited.

Figure 5:
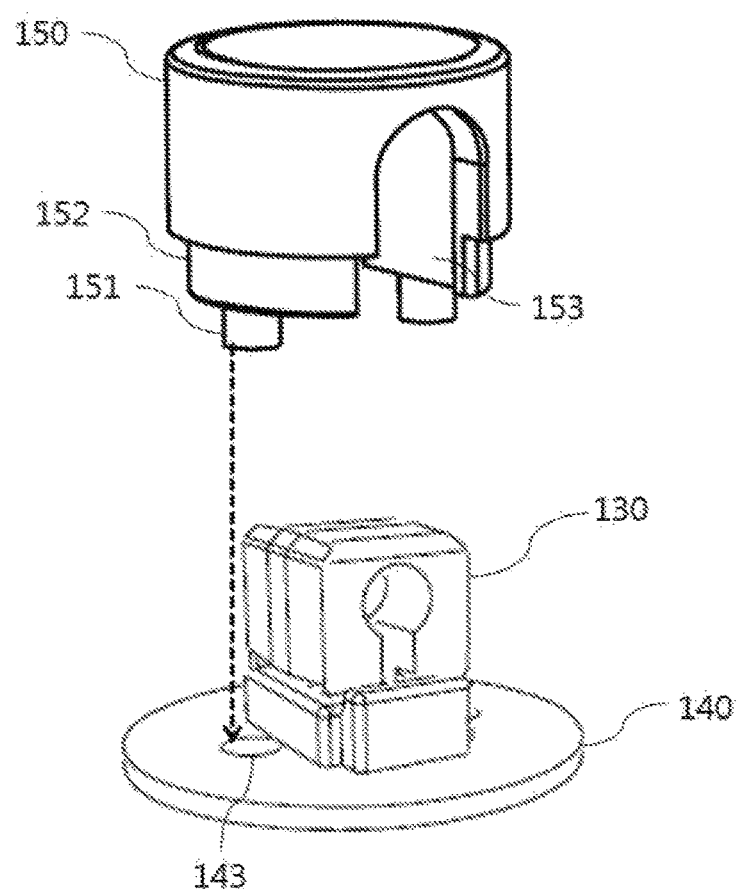
FIG. 5 shows a perspective view of the hinge coupled the coupling part and the cover of the stand of the present invention.

FIG. 5 shows a perspective view of the hinge 130 joining the coupling part 140 and the cover 150 of the stand 100 of the present invention. According to another embodiment, the cover 150 may be made of a rigid material, such as a steel or a plastic like polycarbonate, but not limited. The cover 150 may include a coupling projection 151, a recessed circular surface 152 and a receiving groove 153. The cover 150 may be coupled with the coupling part 140 according to the coupling projection 151 is received in the opening 143 of the coupling part 140. Here, the cover 150 and the coupling part 140 may be coupled with the base 110 because the aperture 111 is positioned on the recessed circular surface 152. However, the cover 150 and the coupling part 140 is rotatably coupled with respect to the base 110. The cover 150 is coupled with the coupling part 140 so that the hinge 130 is received in the receiving groove 153 which forms an inner space of the cover 150. The engaging portion 121 of the ring 120 engaged by the hinge 130 may be engaged with an outside of the cover 150 through the receiving groove 153.

In addition, the receiving groove 153 of the cover 150 and the hinge receiving wall 141 of the coupling part 140 may form a space corresponding to a size of the hinge while the cover 150 is coupled with the coupling part 140 and thus, the hinge 130 may be securely received in the space without movement. Furthermore, both shapes of an upper portion of the hinge 130 and an upper portion of the receiving groove 153 of the cover 150 may be formed to correspond to each other so that the hinge may be more securely received.

According to another embodiment, both sides of the hinge 130 are securely engaged with the cover 150 so that the cylindrical engaging portion 121 and the hinge 130 are fixed by a frictional fit and the user can adjust the orientation of the ring 120 by manually pushing or pulling the ring. After the position of the ring is adjusted, the position of the ring may be maintained by friction between the cylindrical engaging portion and the hinge.

Figure 6:
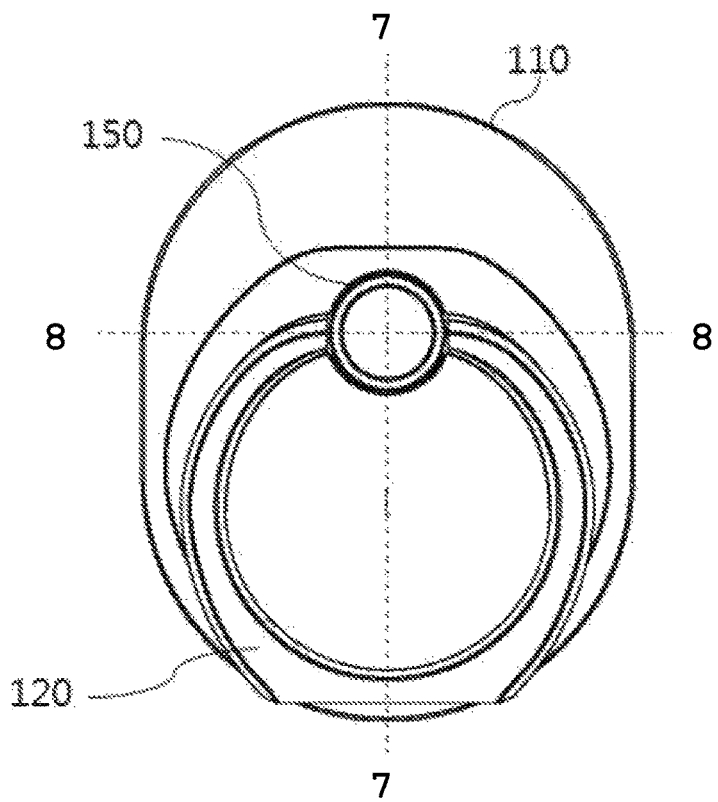
FIG. 6 shows a top plan view of the stand of the present invention wherein the ring is in a closed position.
Figure 7:
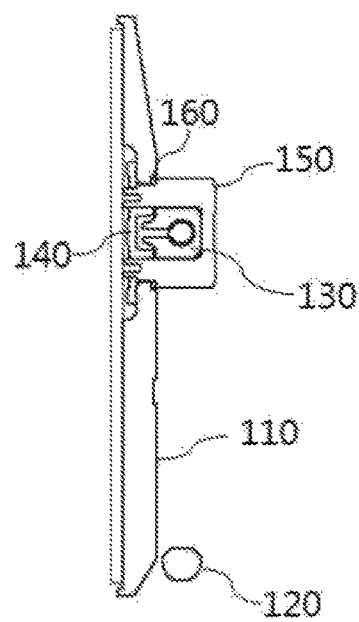
FIG. 7 shows a cross-sectional view of FIG. 6 taken along the line 7-7 in FIG. 6.
Figure 8:
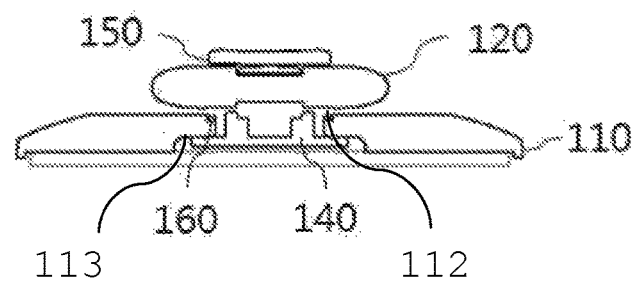
FIG. 8 shows a cross-sectional view of FIG. 6 taken along the line 8-8 in FIG. 6.

FIG. 6 shows a top plan view of the stand of the present invention wherein the ring is in a closed position. FIG. 7 shows a cross-sectional view of FIG. 6 taken along the line A in FIG. 6. FIG. 8 shows a cross-sectional view of FIG. 6 taken along the line B in FIG. 6.

As in FIG. 7, the stand 100 for the electronic device 10 may include the base 110, the ring 120, the hinge 130, the coupling part 140 and the cover 150. In addition, according to another embodiment, as in FIGS. 7 and 8, an O-ring 160 is positioned on the aperture 111. The O-ring 160 may be made of a rigid material, such as a steel or plastic like polycarbonate, but not limited. The O-ring 160 allows the ring 120 coupled with the base 110, the hinge 130, the coupling part 140 and the cover 150 to fit with an appropriate frictional force with respect to the base 110 and smoothly rotate. The O-ring 160 may be replaced another element having a similar function.

Figure 9:
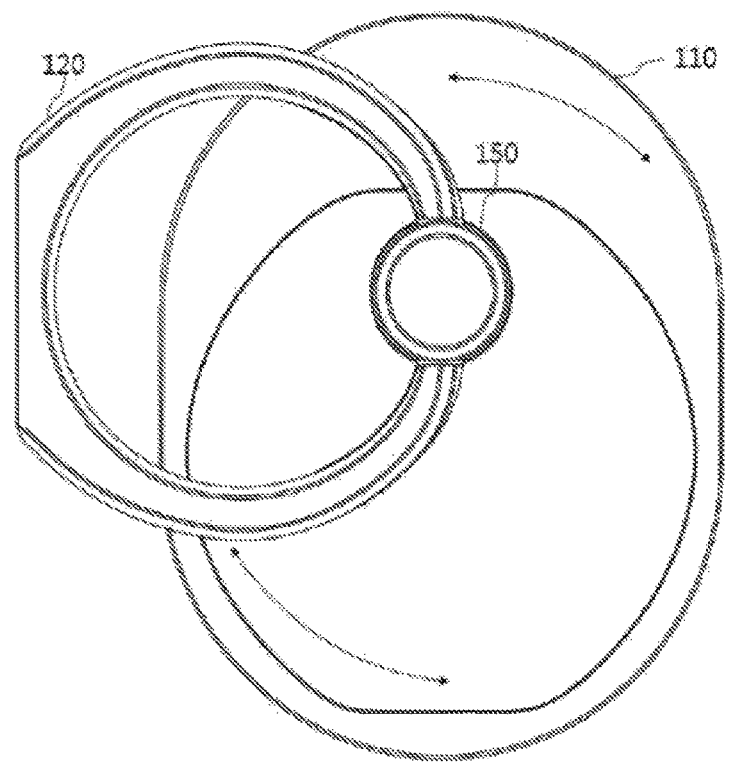
FIG. 9 shows a top plan view of the stand of the present invention wherein the ring is rotatably and pivotably coupled with the base in a closed position.

FIG. 9 shows a top plan view of the stand of the present invention wherein the ring is rotatably and pivotably coupled with the base in a closed position. As shown in FIG. 9, the ring 120, the hinge 130, the coupling part 140, and the cover 150 may be rotatably and pivotably coupled with respect to the base 110 about the center of the aperture 111 of the base 110.

Figure 10:
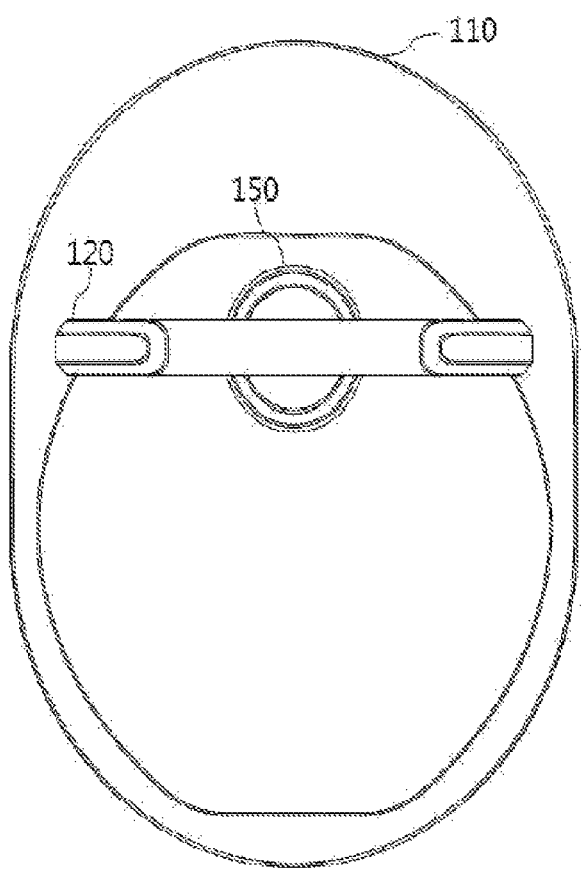
FIG. 10 shows a top plan view of the stand of the present invention wherein the ring is in an upright position.
Figure 11:
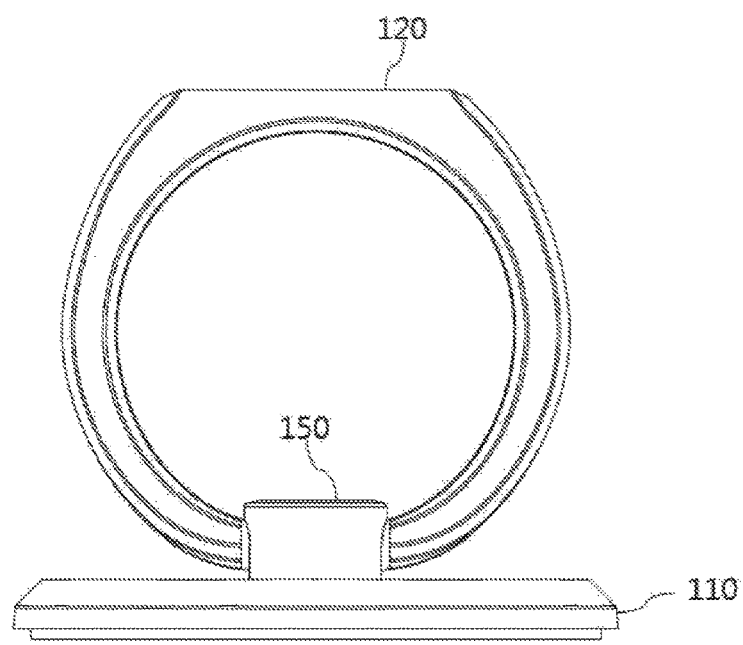
FIG. 11 shows a front view of the stand of the present invention wherein the ring is in an upright position.
Figure 12:
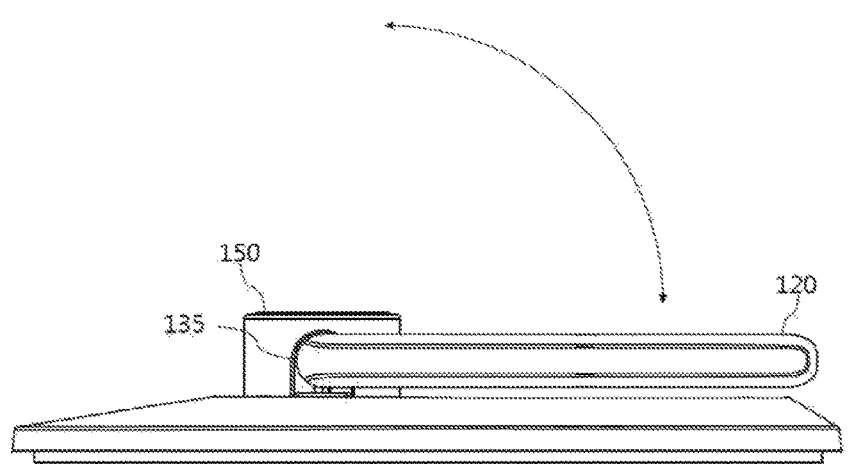
FIG. 12 shows a side view of the stand of the present invention wherein the ring is rotatably and pivotably coupled with base in an open position.
Figure 13A:
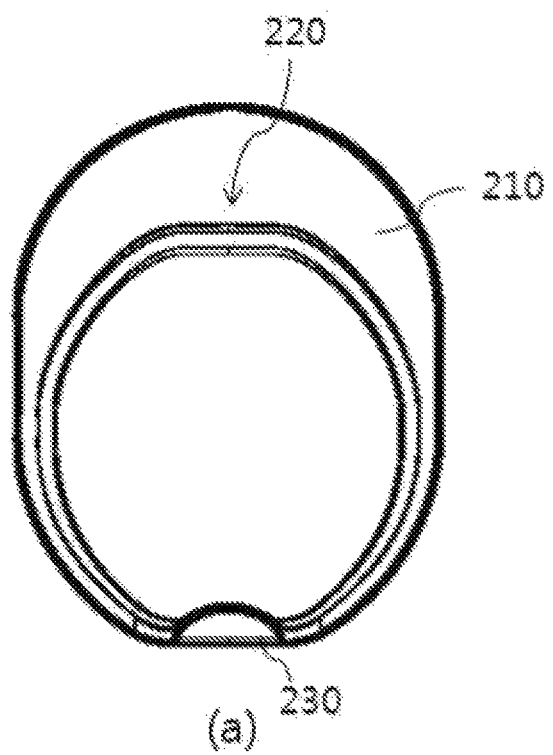
FIGS. 13A-13F show various views of the holder of the present invention.
Figure 13B:
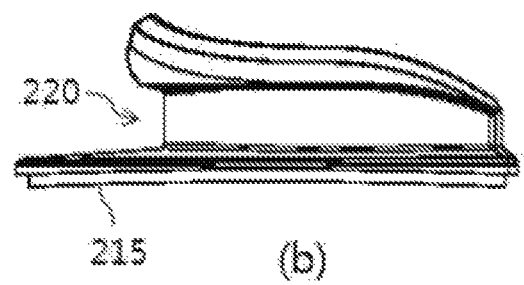
Figure 13C:
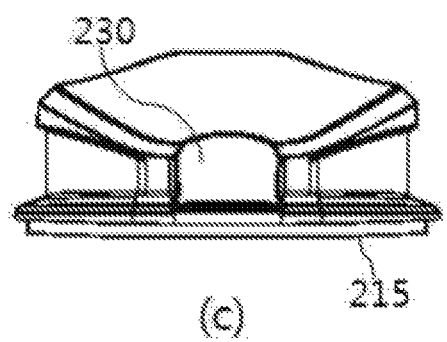
Figure 13D:
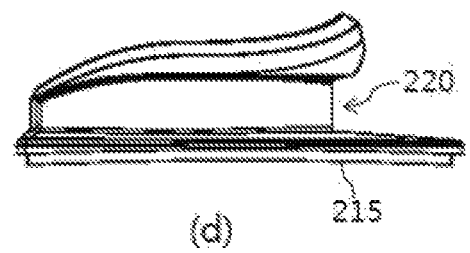
Figure 13E:
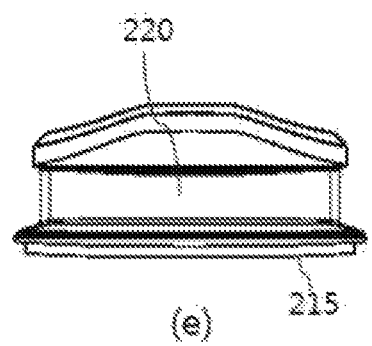
Figure 13F:
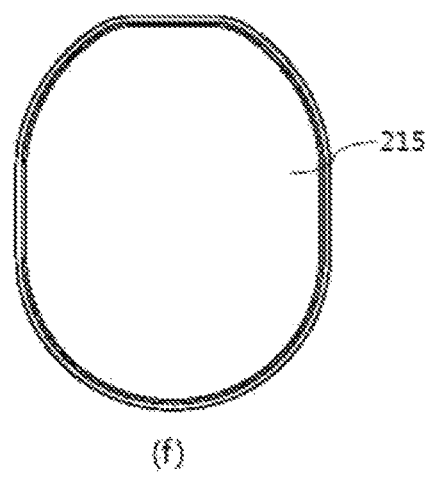

In addition, FIGS. 10 and 11 show a top plan view and a front view of the stand of the present invention wherein the ring 120 is in an upright position. FIG. 12 shows a side view of the stand 100 of the present invention wherein the ring 120 is rotatably and pivotably coupled with the base 110 in a closed position.

As shown in FIG. 9, the ring 120 of the stand 100 for the electronic device 10 may rotate about the center of the engaging portion engaged in the hinge 130. As shown in FIGS. 9 and 12, the user can rotate and pivot the ring 120 to easily hold the electronic device 10 in the user's hand or to stand the electronic device 10 conveniently on a flat surface.

FIGS. 13A-13F show various views of the holder 200 of the present invention. According to another embodiment, the holder 200 may include a recessed groove 220, a cover engaging portion 230 and an adhesive pad 215. The adhesive pad 215 may be provided on a side of a holder base 210. The adhesive pad 215 is made of an elastic material, such as thermoplastic polyurethane, but not limited. The adhesive pad 215 may includes an adhesive layer or sheet. The holder 200 may be attached on an object surface using the adhesive pad 215. In addition, the holder base 210 may be formed from an elastic material and thus, the holder 200 may be attached not only on a flat surface but a curved surface. The adhesive pad 215 is an adhesive gel or pad, but not limited.

The recessed groove 220 may be formed to a size corresponding to an inner diameter of the ring 120 beside a portion of recessed groove received in the cover 150. When the ring is received in the recessed groove 220, the ring 120 may be engaged in the holder 200 through the bump 240 formed along an upper portion of the recessed groove 220.

In addition, the cover 150 of the stand may be engaged in the cover engaging portion 230 to prevent the ring 120 from rotating with respect to the holder 200. Preferably, the cover engaging portion 230 may be a rounded or circular recess and the cover 150 may be rounded or circular.

Figure 14:
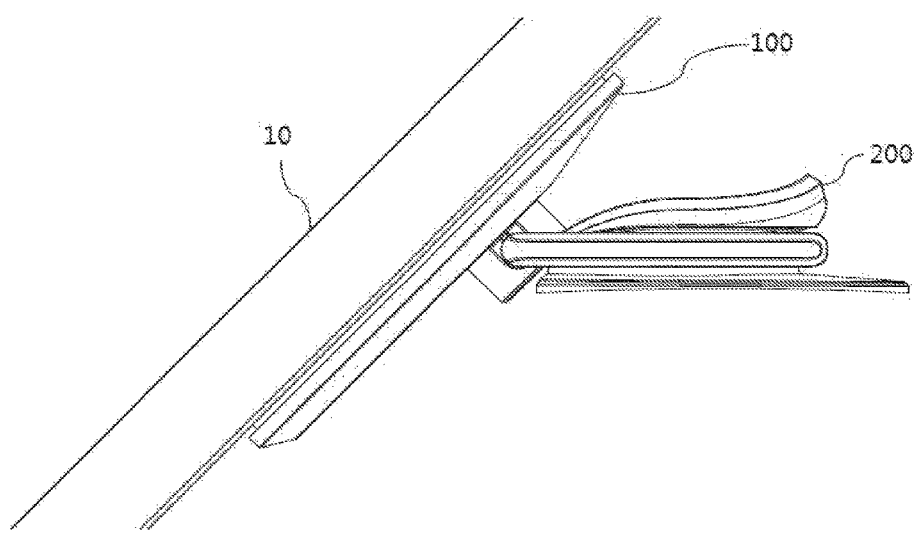
FIG. 14 shows a side view of the stand and the holder of the present invention wherein the ring is mounted in the holder.

FIG. 14 shows a side view of the stand 100 and the holder 200 of the present invention wherein the ring 120 is mounted in the holder 200.

As shown in FIG. 14, the ring 120 is engaged with the holder 200 so that the stand 100 is mounted in the holder 200. By engaging between the stand 100 and the attached holder 200 on the object surface, the user can stand or mount the electronic device to have the stand easily and conveniently.

Figure 15A:
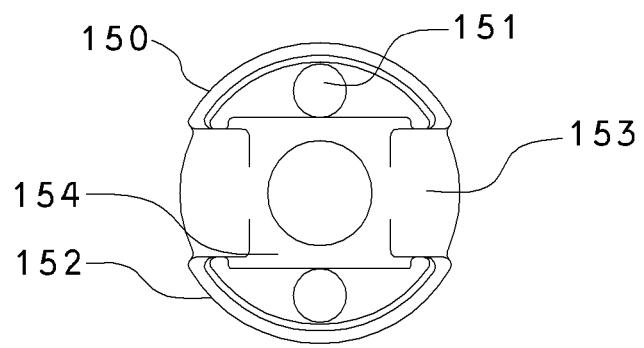
FIG. 15A shows a view of the cover of the present invention.
Figure 15B:
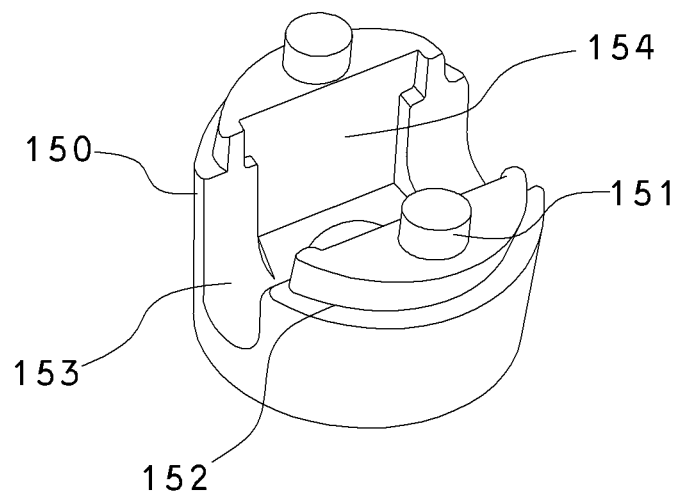
FIG. 15B shows another view of the cover of the present invention.

FIGS. 15A and 15B show the cover of the present invention.

A stand 100 for an electronic device 10 includes a base 110 having a top surface and a bottom surface, wherein an adhesive pad 115 is attached to the bottom surface of the base 110; an enclosed ring 120 having a cylindrical engaging portion 121; a hinge 130, having an engaging groove 131, wherein the hinge 130 is constructed to receive the engaging portion 121 of the ring 120 in the engaging groove 131 so that the ring 120) can rotates with respect to the hinge 130 and wherein the hinge 130 is made of an elastic material; a cover 150, having a receiving groove 153, wherein the cover is constructed to receive the hinge 130 in the receiving groove 153; and a circular mating plate 142, placed between the base 110 and the adhesive pad 115, wherein the mating plate 142 is fixedly attached to the cover 150 so that the mating plate 142 and the cover 150 can rotate with respect to the base 110.

The cover 150 may further comprise a pair of recessed circular surfaces 152. The base 110 may further comprise an aperture 111. A top recess 112 may be formed on the top surface of the base 110 and on a rim of the aperture 111, and a bottom recess 113 may be formed on the bottom surface of the base 110 and on a rim of the aperture 111. Preferably, the pair of recessed circular surfaces 152 are received in the top recess 112 and the mating plate 142 is received in the bottom recess 113.

The pair of the recessed circular surfaces 152 may be received and rotatably retained in the top recess 112 by a friction fit. In other words, the cover 150 is secured to the base 110 by a friction fit, but the cover 150 can rotate with respect to the base 110.

The stand may further comprise an O-ring 160 retained by the pair of recessed circular surfaces 152 in between the cover 150 and the base 110. Preferably, the O-ring 160 is made of a thermoplastic material.

The cover 150 may include a pair of coupling projections 151 which are fixedly attached to the mating plate 142, and the mating plate 142 may further include a pair of openings 143. Preferably, the pair of coupling projections 151 are respectively and fixedly attached to the pair of openings 143 of the mating plate 142 by soldering. Furthermore, surrounding recesses may be respectively formed around the openings 143 to receive a solder therein.

The hinge 130 may have a pair of side walls 133 to form the engaging groove 131, and preferably, the receiving groove 153 of the cover 150 pushes the side walls 133 inwardly toward each other. In this way, the friction between the hinge 130 and the cylindrical engaging portion increases, and thus, the ring can rotate, but after rotation, it can stably stay at a certain angle.

A pair of recesses 154 may be formed on the receiving groove 153 of the cover 150 for respectively receiving the side walls 133 of the hinge 130.

The hinge 130 may include a pair of protrusions 132 and a hinge receiving wall 141 may be fixedly attached to the mating plate 142. Preferably, the hinge receiving wall 141 receives the protrusions 132 of the hinge 130 therein. Additionally, a pair of supporting walls 144 may be fixedly attached to the mating plate on both sides of the hinge receiving wall 141 to prevent the ring 120 from getting closer to the mating plate 142.

The stand may further comprise a holder 200, which comprises a recessed groove 220, a cover engaging portion 230, and an adhesive pad 215. The recessed groove 220 is constructed to removably receive the ring 120 and the cover engaging portion 230 is constructed to removably receive the cover 150. Preferably, the cover 150 is circular and the cover engaging portion 230 is circular as well so that the cover 150 fits in the cover engaging portion 230.

The hinge 130 may be made of thermoplastic polyurethane. Alternatively, the hinge 130 may be made of one or more materials selected from the group consisting of polyoxymethyene, polyformaldehyde, and polyacetal.

In the alternative embodiment, a stand 100 for an electronic device 10 may include a base 110 having a top surface and a bottom surface, wherein an adhesive pad 115 is attached to the bottom surface of the base 110; a ring 120 having a cylindrical engaging portion 121; a hinge 130, having an engaging groove 131, wherein the hinge 130 is constructed to receive the engaging portion 121 of the ring 120 in the engaging groove 131 so that the ring 120 can rotates with respect to the hinge 130 and wherein the hinge 130 is made of an elastic material; a cover 150, having a receiving groove 153, wherein the cover is constructed to receive the hinge 130 in the receiving groove 153; and a mating plate 142, placed between the base 110 and the adhesive pad 115, wherein the mating plate 142 is fixedly attached to the cover 150.

The cover 150 may include a pair of coupling projections 151 which are fixedly attached to the mating plate 142, and the mating plate 142 may further include a pair of openings 143. Preferably, the pair of coupling projections 151 are respectively and fixedly attached to the pair of openings 143 of the mating plate 142 by soldering.

The hinge 130 may include a pair of side walls 133 to form the engaging groove 131, and preferably, the receiving groove 153 of the cover 150 pushes the side walls 133 inwardly toward each other.

While the invention has been shown and described with reference to different embodiments thereof, it will be appreciated by those skilled in the art that variations in form, detail, compositions and operation may be made without departing from the spirit and scope of the invention as defined by the accompanying claims.

DESCRIPTION OF REFERENCE NUMERAL

100: Stand for an electronic device
110: Base
111: Aperture
112: Top recess
113: Bottom recess
115: Adhesive pad
120: Ring
121: Engaging portion
122: Flat portion
130: Hinge
131: Engaging groove
132: Protrusion
133: Side wall
140: Coupling part
141: Hinge receiving wall
142: Mating plate
143: Opening
144: Supporting wall
150: Cover
151: Coupling projection
152: Recessed circular surface
153: Receiving groove
154: Recess
160: O-ring
200: Holder
210: Holder base
215: Adhesive pad
220: Recessed groove
230: Cover engaging portion
240: Bump
10: Electronic device

What is claimed is:

1. A stand (100) for an electronic device (10), comprising:
a base (110) having a top surface and a bottom surface, wherein an adhesive pad (115) is attached to the bottom surface of the base (110);
a single piece, fully enclosed ring (120) having a cylindrical engaging portion (121);
a hinge (130), having an engaging groove (131) with a curved engaging wall, wherein the hinge (130) is constructed to receive the cylindrical engaging portion (121) of the ring (120) in the engaging groove (131) through an opening of the engaging groove (131) so that the ring (120) can rotate with respect to the hinge (130) and wherein the hinge (130) is made of an elastic material;
a cover (150), having a receiving groove (153), wherein the cover is constructed to receive the hinge (130) in the receiving groove (153); and
a circular mating plate (142), placed between the base (110) and the adhesive pad (115), wherein the mating plate (142) is fixedly attached to the cover (150) so that the mating plate (142) and the cover (150) can rotate with respect to the base (110).

2. The stand of claim 1, wherein the cover (150) further comprises a pair of recessed circular surfaces (152).

3. The stand of claim 2, wherein the base (110) further comprises an aperture (111),
wherein a top recess (112) is formed on the top surface of the base (110) and on a rim of the aperture (111),
wherein a bottom recess (113) is formed on the bottom surface of the base (110) and on a rim of the aperture (111), and
wherein the pair of recessed circular surfaces (152) are received in the top recess (112) and the mating plate (142) is received in the bottom recess (113).

4. The stand of claim 3, wherein the pair of the recessed circular surfaces (152) are received and rotatably retained in the top recess (112) by a friction fit.

5. The stand of claim 2, further comprising an O-ring (160) retained by the pair of recessed circular surfaces (152) in between the cover (150) and the base (110).

6. The stand of claim 5, wherein the O-ring (160) is made of a thermoplastic material.

7. The stand of claim 1, wherein the cover (150) has a pair of coupling projections (151) which are fixedly attached to the mating plate (142).

8. The stand of claim 7, wherein the mating plate (142) further comprises a pair of openings (143), and wherein the pair of coupling projections (151) are respectively and fixedly attached to the pair of openings (143) of the mating plate (142) by soldering.

9. The stand of claim 8, wherein surrounding recesses are respectively formed around the openings (143) to receive a solder therein.

10. The stand of claim 1, wherein the hinge (130) has a pair of side walls (133) to form the engaging groove (131), and wherein the receiving groove (153) of the cover (150) pushes the side walls (133) inwardly toward each other.

11. The stand of claim 10, wherein a pair of recesses (154) are formed on the receiving groove (153) of the cover (150) for respectively receiving the side walls (133) of the hinge (130).

12. The stand of claim 1, wherein the hinge (130) has a pair of protrusions (132) and a hinge receiving wall (141) is fixedly attached to the mating plate (142), and wherein the hinge receiving wall (141) receives the protrusions (132) of the hinge (130) therein.

13. The stand of claim 12, wherein a pair of supporting walls (144) are fixedly attached to the mating plate on both sides of the hinge receiving wall (141) to prevent the ring (120) from getting closer to the mating plate (142).

14. The stand of claim 1, further comprising a holder (200), which comprises a recessed groove (220), a cover engaging portion (230), and an adhesive pad (215), wherein the recessed groove (220) is constructed to removably receive the ring (120) and the cover engaging portion (230) is constructed to removably receive the cover (150).

15. The stand of claim 14, wherein the cover (150) is circular and the cover engaging portion (230) is circular as well so that the cover (150) fits in the cover engaging portion (230).

16. The stand of claim 1, wherein the hinge (130) is made of thermoplastic polyurethane.

17. The stand of claim 1, wherein the hinge (130) is made of one or more materials selected from the group consisting of polyoxymethyene, polyformaldehyde, and polyacetal.

18. A stand (100) for an electronic device (10), comprising:
   a base (110) having a top surface and a bottom surface, wherein an adhesive pad (115) is attached to the bottom surface of the base (110);
   a single piece, fully ring (120) having a cylindrical engaging portion (121);
   a hinge (130), having an engaging groove with a curved engaging wall, wherein the hinge (130) is constructed to receive the cylindrical engaging portion (121) of the ring (120) in the engaging groove (131) through an opening of the engaging groove (131) so that the ring (120) can rotate with respect to the hinge (130) and wherein the hinge (130) is made of an elastic material;
   a cover (150), having a receiving groove (153), wherein the cover is constructed to receive the hinge (130) in the receiving groove (153); and
   a mating plate (142), placed between the base (110) and the adhesive pad (115), wherein the mating plate (142) is fixedly attached to the cover (150).

19. The stand of claim 18, wherein the cover (150) has a pair of coupling projections (151) which are fixedly attached to the mating plate (142),
   wherein the mating plate (142) further comprises a pair of openings (143), and
   wherein the pair of coupling projections (151) are respectively and fixedly attached to the pair of openings (143) of the mating plate (142) by soldering.

20. The stand of claim 19, wherein the hinge (130) has a pair of side walls (133) to form the engaging groove (131), and wherein the receiving groove (153) of the cover (150) pushes the side walls (133) inwardly toward each other.

* * * * *